United States Patent
Sonoda et al.

(10) Patent No.: US 10,103,077 B2
(45) Date of Patent: Oct. 16, 2018

(54) SEALING CAP FOR ELECTRONIC COMPONENT

(71) Applicant: TANAKA KIKINZOKU KOGYO K.K., Chiyoda-ku, Tokyo (JP)

(72) Inventors: Sadatoshi Sonoda, Hiratsuka (JP); Takuji Iwatani, Hiratsuka (JP); Kenichi Miyazaki, Hiratsuka (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 0 days.

(21) Appl. No.: 15/549,271

(22) PCT Filed: Mar. 10, 2016

(86) PCT No.: PCT/JP2016/057530
§ 371 (c)(1),
(2) Date: Aug. 7, 2017

(87) PCT Pub. No.: WO2016/143845
PCT Pub. Date: Sep. 15, 2016

(65) Prior Publication Data
US 2018/0033706 A1 Feb. 1, 2018

(30) Foreign Application Priority Data
Mar. 11, 2015 (JP) .................. 2015-048786

(51) Int. Cl.
*H01L 23/10* (2006.01)
*H01L 23/051* (2006.01)
*H01L 23/29* (2006.01)

(52) U.S. Cl.
CPC ............ *H01L 23/051* (2013.01); *H01L 23/10* (2013.01); *H01L 23/298* (2013.01);
(Continued)

(58) Field of Classification Search
None
See application file for complete search history.

(56) References Cited

U.S. PATENT DOCUMENTS 4,709,122 A * 11/1987 Samuels ................. H01L 21/50
174/50.5
4,967,315 A * 10/1990 Schelhorn ............ H05K 5/0095
174/377
(Continued)

FOREIGN PATENT DOCUMENTS

JP 5-90429 A 4/1993
JP 2002-151614 A 5/2002
(Continued)

OTHER PUBLICATIONS

US 9,984,899, 05/2018, Suzuki (withdrawn)*
PCT, International Search Report for PCT/JP2016/057530, dated May 24, 2016.

*Primary Examiner* — Xanthia C Cunningham
(74) *Attorney, Agent, or Firm* — Orrick, Herrington & Sutcliffe LLP; Joseph A. Calvaruso

(57) ABSTRACT

An electronic component cap for producing a package having a sealed region by being bonded to a base, having a brazing material-fused surface to which a brazing material is fused and a sealing surface corresponding to the sealed region. The brazing material-fused surface has a non-flat work surface formed by plastic working, and a ratio (Sc/Sf) of a surface area (Sc) of the brazing material-fused surface per unit area to a surface area (Sf) of the sealing surface per unit area satisfies $1<Sc/Sf\leq1.6$. The cross-sectional shape of the work surface may be one of various shapes such as a groove shape, an approximately V shape, and a circular-arc shape. The cap has a good wettability when a brazing
(Continued)

(a) FLAT PLATE CAP (b) CAP WITH CAVITY material is fused. Also, the brazing material does not wet-spread excessively when the brazing material is melted again for sealing work.

20 Claims, 6 Drawing Sheets

(52) U.S. Cl.
CPC ............... *H01L 2224/45144* (2013.01); *H01L 2924/16153* (2013.01); *H01L 2924/16195* (2013.01)

(56) References Cited

U.S. PATENT DOCUMENTS

| | | | | |
|---|---|---|---|---|
| 5,280,413 | A * | 1/1994 | Pai | H01L 23/057 174/17.05 |
| 5,447,886 | A * | 9/1995 | Rai | H01L 24/81 228/180.22 |
| 5,742,007 | A * | 4/1998 | Kornowski | H01L 21/6835 174/535 |
| 5,744,752 | A * | 4/1998 | McHerron | H01L 23/10 174/521 |
| 5,881,945 | A * | 3/1999 | Edwards | H01L 21/50 228/124.6 |
| 5,945,735 | A * | 8/1999 | Economikos | H01L 23/10 257/704 |
| 6,046,074 | A * | 4/2000 | McHerron | H01L 23/10 257/E23.193 |
| 6,342,407 | B1 * | 1/2002 | Goldmann | H01L 23/10 257/E23.193 |
| 7,065,867 | B2 * | 6/2006 | Kim | B81C 1/00269 174/250 |
| 7,291,513 | B2 * | 11/2007 | Ouellet | B81C 1/00269 257/E23.128 |
| 7,517,712 | B2 * | 4/2009 | Stark | B81B 7/0067 257/E21.499 |
| 7,640,647 | B2 * | 1/2010 | Rumer | H01L 21/50 156/256 |
| 7,642,642 | B2 * | 1/2010 | Fazzio | H01L 23/10 257/704 |
| 7,743,963 | B1 * | 6/2010 | Chung | H01L 23/047 156/230 |
| 8,014,167 | B2 * | 9/2011 | Gunderson | F16J 15/102 174/250 |
| 8,431,835 | B2 * | 4/2013 | Chiang | G03F 7/0012 174/563 |
| 9,334,154 | B2 * | 5/2016 | Kennedy | B81B 7/0048 |
| 9,350,318 | B2 * | 5/2016 | Aoki | H03H 9/1014 |
| 9,490,772 | B2 * | 11/2016 | Hasegawa | H03H 9/0552 |
| 2006/0187608 | A1 * | 8/2006 | Stark | C03C 27/08 361/202 |
| 2010/0270669 | A1 * | 10/2010 | Medeiros, III | H01L 23/055 257/692 |
| 2014/0084752 | A1 * | 3/2014 | Miyasaka | G01C 19/5628 310/348 |
| 2014/0174803 | A1 * | 6/2014 | Suzuki | H05K 1/0306 174/258 |
| 2014/0269220 | A1 * | 9/2014 | Tamura | H03H 9/21 368/47 |
| 2014/0319982 | A1 * | 10/2014 | Yamamoto | H05K 1/183 312/223.1 |

FOREIGN PATENT DOCUMENTS

| | | |
|---|---|---|
| JP | 2005-216930 A | 8/2005 |
| JP | 2006-32492 A | 2/2006 |
| JP | 2009-10170 A | 1/2009 |
| JP | 2010-226064 A | 10/2010 |

* cited by examiner (a) FLAT PLATE CAP (b) CAP WITH CAVITY (a)

(b)

SEALING CAP FOR ELECTRONIC COMPONENT

TECHNICAL FIELD

The present invention relates to a cap (lid) that is used for producing a package of various electronic components. In particular, there is provided a sealing cap that can suppress excessive wet-spreading of a brazing material in sealing and that can reduce an amount of gold plating in performing fusion fixation of the brazing material.

BACKGROUND ART

Many of electronic devices such as SAW filters, FBAR filters, and quartz oscillators are supplied in a mode of a package that is air-tightly sealed for protection of an element function part. A general configuration of this sealed package is such that a sealing structure is formed by covering a base, on which the element is mounted and fixed, with a cap serving as a lid.

In many cases, the shapes of the base and the cap of the sealed package are such that a cap having a flat plate shape is combined with a container-shaped base having a cavity. Conversely, there is also recently reported a structure in which a cavity is formed in a cap; an element is fixed to a base having a flat plate shape; and the cap is bonded to the base. This configuration in which a cavity is formed in a cap is a mode that is attracting people's attention in recent years because the configuration can contribute to cost reduction of the device by making the process of fixing the element to the base be efficient.

In bonding between the cap and the base, using a brazing material is effective for ensuring air-tightness in the inside of the package. As this brazing material, an Au-based brazing material (for example, Au—Sn-based brazing material) is often used from the reasons such as reliability and corrosion resistance. In package sealing to which a brazing material is applied, the brazing material is fused and fixed onto the cap in advance; the base is covered with the cap when the sealing work is performed; and the brazing material is melted again for bonding. FIG. 1 is a view for describing a step of producing a package to which a cap and a base are applied.

FIG. 2 is a view for describing a step of fusing and fixing the brazing material onto the cap before sealing the package. In both of a flat plate cap and a cap with a cavity, a brazing material-fused surface is set with a specification of the package taken into consideration. Typically, in the case of a flat plate cap, a brazing material-fused surface having a frame shape is set along the four sides of the cap (FIG. 2(a)). In a cap with a cavity, a brazing material-fused surface having a frame shape is set on the end surface of the cap (FIG. 2(b)). In the cap with a cavity, the end surface of a cap body that forms the cavity is bent to form a flange part having a brim shape, and this flange surface is set as the brazing material-fused surface.

A frame-shaped brazing material (Au-based brazing material) is fused and fixed onto these brazing material-fused surfaces; however, before that, Au plating is typically applied on the surface of the cap. This is in consideration of the material of the cap (where kovar (Fe—Ni—Co-based alloy), 42 alloy (Fe—Ni-based alloy), or the like is used). In other words, a molten Au-based brazing material has a poor wettability and hence raises a possibility that the frame shape may be collapsed when the brazing material is melted, so that Au plating is applied for ensuring the wettability on the surface of the cap. Also, for preventing oxidation of kovar, Ni plating may be applied before the Au plating. Further, the brazing material is fused after the plating process is performed in this manner.

In the meantime, a matter that must be paid attention to in performing the package sealing with use of the sealing cap prepared in the above-described manner is suppression of the flowing of the brazing material into the sealed region. At the time of sealing, the brazing material is melted again, and during that time, the brazing material may possibly be wet-spread and flow onto the surface of the base on which an element is to be mounted. The situation in which the brazing material flows onto the surface of the base to be brought into contact with the element is not preferable because this may lead to damages of the element.

A sealing cap prepared with the wet-spreading of the brazing material in sealing in mind may be, for example, a cap (lid) disclosed in Patent Document 1. This cap relates to a flat plate cap, which is produced through Ni plating and Au plating, putting a cap having a fused frame-shaped brazing material into a container together with a polishing medium, and swinging the container to perform polishing. By this polishing, almost all of the Au plating on the inside of cap is peeled off, and the remaining slight amount of Au is turned into an alloy together with the Ni plating. Since the Au-based brazing material has a poor wettability to Ni alloy, the flowing and spreading of the brazing material can be controlled.

RELATED ART DOCUMENT

Patent Documents

Patent Document 1: JP 2010-226064 A

SUMMARY OF THE INVENTION

Problems to be Solved by the Invention

The peeling-off of the Au plating on the surface of the cap such as described above has a certain effect on the problem of wet-spreading of the brazing material. However, though this technique seems to be useful for a cap having a plate shape, the technique is not effective on the cap with a cavity having a depth. This is because sufficient polishing may not be performed on the step difference such as the side surface part of the cavity.

Further, peeling-off of Au that was once plated such as described above can hardly be said a preferable technique from the viewpoint of saving resources. Here, with regard to Au plating, problems from this another viewpoint of saving resources are currently pointed out. Au is a precious metal and is an expensive metal. In view of the demand for cost reduction in recent years, reducing the amount of Au plating to be as little as possible is preferable. However, to let the wettability exhibited on the molten brazing material, a predetermined amount or more of Au is needed on the surface of the cap. Therefore, the amount of plating cannot be reduced without careful consideration.

The present invention has been made in view of the aforementioned background and provides a package sealing cap that can suppress wet-spreading of the re-molten brazing material at the time of sealing work while a suitable wettability can be exhibited in fusing the Au-based brazing material. This effect is exhibited irrespective of the mode of the cap. Further, simultaneously with this, a cap is provided that can reduce the amount of plating in performing the Au plating as compared with the conventional art.

Means for Solving the Problems

The present invention to solve the problem is an electronic component cap for producing a package having a sealed region by being bonded to a base, having a brazing material-fused surface to which a brazing material is fused and a sealing surface corresponding to the sealed region, wherein the brazing material-fused surface has a non-flat work surface formed by plastic working, and a ratio (Sc/Sf) of a surface area (Sc) of the brazing material-fused surface per unit area to a surface area (Sf) of the sealing surface per unit area satisfies 1<Sc/Sf≤1.6.

In the electronic component cap according to the present invention, the surface onto which a brazing material is fused (brazing material-fused surface) is changed from a flat surface to a three-dimensional surface. By imparting such a three-dimensional processed surface to the brazing material-fused surface, the flow when the fused brazing material is melted again is controlled, and the re-molten brazing material is allowed to prevent itself from being wet-spread over to the sealing surface.

Further, in the present invention, by imparting the three-dimensional work surface to the brazing material-fused surface, the surface area of the region is made larger than the surface area of the sealed region. Increase in the surface area leads to increase in the amount of Au mass that adheres when the Au plating is applied. In other words, a state is formed in which the Au mass of the brazing material-fused surface is larger than the Au mass of the sealing surface. In this respect, an equal amount of Au plating was formed over the whole surface in a conventional sealing cap; however, inherently, it is sufficient that a needed amount of Au plating is formed at a needed site (brazing material-fused surface). In the present invention, by imparting a gradient to the surface area to increase the amount of Au plating on the brazing material-fused surface, the brazing material wettability is made to be preferentially satisfied on the brazing material-fused surface as compared with other sites. This allows the Au plating treatment to be completed at a timing earlier than in the conventional art, thereby reducing the amount of using Au.

In the present invention, with regard to this gradient of the surface area, a ratio (Sc/Sf) of a surface area (Sc) of the brazing material-fused surface per unit area to a surface area (Sf) of the sealing surface per unit area is set to satisfy 1<Sc/Sf≤1.6. This unit area is determined by using a horizontal projection surface of the brazing material-fused surface and the sealed region as a standard. Further, in the present invention, the surface area ratio (Sc/Sf) of the two sites is set to have a value larger than 1. This allows that the aforementioned suppression of wet-spreading of the brazing material and the gradient of the Au plating amount function effectively. On the other hand, since the cap is a minute member, it is difficult to perform processing such that Sc/Sf exceeds 1.6 on the cap. Here, Sc/Sf preferably satisfies 1.005≤Sc/Sf≤1.5, more preferably 1.01≤Sc/Sf≤1.45, and still more preferably 1.04≤Sc/Sf≤1.4.

Specific modes of the processed surface of the sealing cap according to the present invention can be described with examples such as shown in FIGS. 3 to 6. First, a configuration can be mentioned in which at least one line of groove is formed on the brazing material-fused surface (FIG. 3). In the figure, the cross-sectional shape of the work surface has a shape including a groove that protrudes from the flat surface. This groove may be one having a rounded tip end such as shown in FIG. 3 or one having an acute angle. Further, a plurality of the grooves may be formed.

The processed surface may have a configuration in which the brazing material-fused surface is tilted. Referring to FIG. 4, there is one having a linear gradient from the end parts toward the center. The cross-sectional shape at this time has an approximately V shape.

Furthermore, the slope of the processed surface may be curved. For example, referring to FIG. 5, the work surface may be processed to have a circular-arc shape that extends downwards from both ends toward a center. The processed surface having a circular-arc-shaped cross-section is, in some cases, particularly suitable. The base of the package may be processed to have a circular-arc-shaped surface through metallization treatment (material: tungsten) and an Au plating/Ni plating treatment in order to ensure the wettability of the AuSn brazing material. By setting a processed surface having a circular-arc shape in the cap as in the present invention, the property of the base to follow the metallized surface becomes good, thereby contributing to reduction of the brazing material amount and improvement in the adhesion (See FIG. 9).

Furthermore, besides the above-described groove processing or processing to impart a slope to the surface, partially concave or convex parts may be formed. In other words, at least one of a protrusion that protrudes upwards and a recess that protrudes downwards may be formed as the work surface. FIG. 6 shows one example thereof, where a plurality of protrusions having a pyramid shape are formed in the brazing material-fused surface.

The brazing material-fused surface having one of various kinds of processed surfaces described above functions as a liquid pool of the brazing material melted in the groove or at the tip end of the slope part. Also, since the protrusion functions as an obstacle to the brazing material, unnecessary wet-spreading of the brazing material is inhibited. Here, the height or depth in the up-and-down direction of the processed surface described above is preferably 3 μm or more and 15 μm or less as measured with both ends of the brazing material-fused surface serving as a standard.

The material constituting the sealing cap according to the present invention can be similar to that of a conventional cap. Typically, kovar alloy (Fe—Ni—Co-based alloy) or 42 alloy (Fe—Ni-based alloy) is applied as a material constituting a cap. These can be applied in the present invention as well. Since these materials have processability, it is easy to form a processed surface.

Further, the cap according to the present invention is used in a state in which an Au-based brazing material is fused onto the brazing material-fused surface of the cap. Examples of the Au-based brazing material that can be used include Au—Sn-based brazing material (for example, Au—18 to 25% Sn), Au—Ge-based brazing material (Au-10 to 15 wt % Ge), Au—Si-based brazing material (Au-2 to 5 wt % Si), and Au—Sb-based brazing material (Au-30 to 40 wt % Sb). The thickness of the Au-based brazing material after being fused is typically set to be 5 μm or more and 30 μm or less.

Here, as described above, in fusing the Au-based brazing material, providing a Ni-plating layer is preferable in order to ensure the adhesion of the brazing material. Further, providing Au plating is preferable in order to ensure wettability at the time of fusing the brazing material. Here, the Au plating formed on the brazing material-fused surface will be integrated with the brazing material in the subsequent step of fusing the Au-based brazing material. Therefore, in a cross-section after fusion of the brazing material, a layer configuration of cap/Ni-plating layer/brazing material is seen, so that a clear and definite Au-plating layer is not observed.

The shape of the cap of the present invention may be a flat plate shape. In this case, a general mode is such that a frame-shaped brazing material-fused surface is set along the four sides of the cap.

Also, the present invention can be applied to a cap with a cavity and can exhibit an advantageous effect. This cap has a box shape in which a cavity is formed. The brazing material-fused surface can be set in a frame shape along the end surface of the surface. This cap with a cavity may include a cap body that forms the cavity and a flange part having a brim shape formed at an end of the cap body. In this case, the brazing material-fused surface having a frame shape can be set along the end surface of the flange.

A method of producing the cap according to the present invention described above is characterized in forming a processed surface. The processed surface can be formed after molding the cap into various kinds of shapes. Also, the processed surface can be formed in parallel with the step of molding the cap.

In other words, on the cap after being molded into various kinds of shapes, a pressing treatment using a mold corresponding to the processed surface can be performed on the brazing material-fused surface, thereby to form the processed surface.

Also, when the processed surface is formed in parallel with the step of molding the cap, for example, with respect to the cap having a flat plate shape, a material having a sheet shape may be subjected to shearing, so as to produce the cap. By performing mold pressing simultaneously with the shearing in this step, molding of the cap and forming of the processed surface can be simultaneously performed.

A cap with a cavity can be simultaneously subjected to molding and processed surface formation. In particular, this method is effective for producing a cap with a cavity that is provided with a flange. The cap with a cavity can be molded and produced by drawing or molding of a flat plate. In so-called drawing or molding, a flat plate material is fixed with a jig, and a tool is pressed onto the material while the end of the material is held, thereby the box body having a cavity is molded. The pressed part in this step becomes a flange. Therefore, by forming a mold that corresponds to the processed surface in the pressing jig, a desired processed surface can be formed on the flange surface.

Advantageous Effects of the Invention

As described above, the sealing cap according to the present invention allows the wet-spreading of the molten brazing material at the time of sealing the package to be controlled by imparting a predetermined processed surface to the brazing material-fused surface. Further, the present invention allows a sufficient amount of Au to be plated at needed sites while restricting the amount of Au plating for brazing material (Au-based brazing material) fusion.

DESCRIPTION OF EMBODIMENTS

First Embodiment

Hereafter, preferable embodiments of the present invention will be described. In the present embodiment, a sealing cap with a cavity having a flange in which groove processing had been performed on a flange surface was produced.

Figure 1:
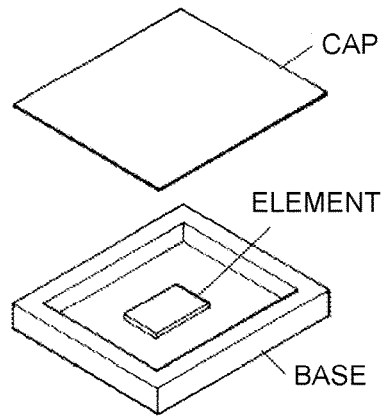
FIG. 1 is a view describing a step of producing a package by bonding between a cap and a base.
Figure 1:
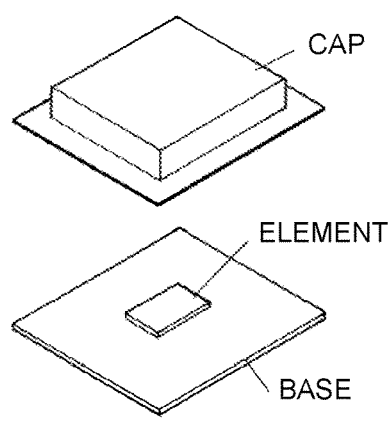
Figure 2:
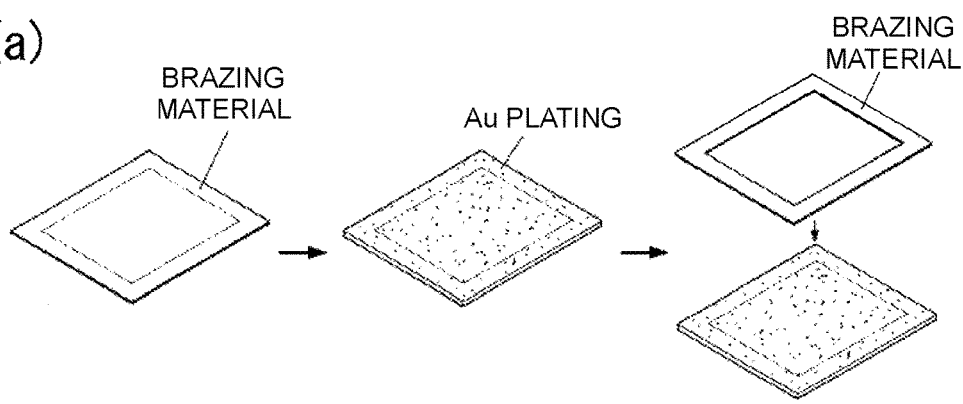
FIG. 2 is a view describing a step of producing a cap (Au plating and brazing material fusion).
Figure 2:
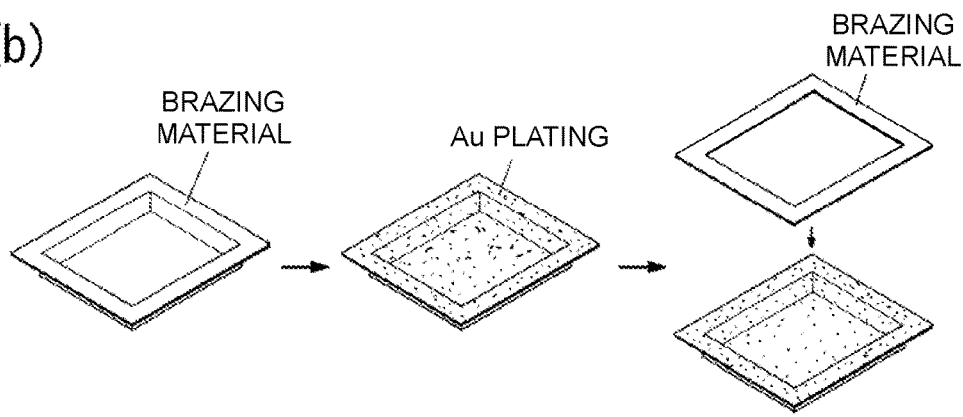
Figure 3:
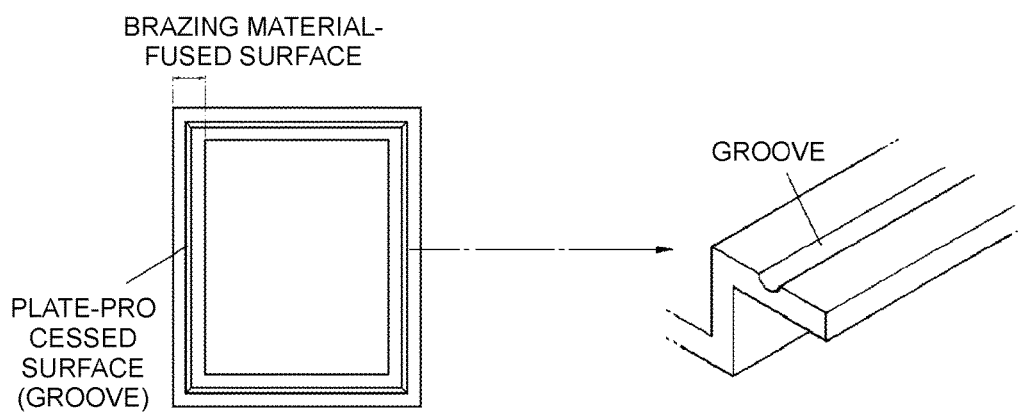
FIG. 3 is a view describing a specific shape (groove formation) of a brazing material-fused surface (work surface) in a sealing cap according to the present invention.
Figure 4:
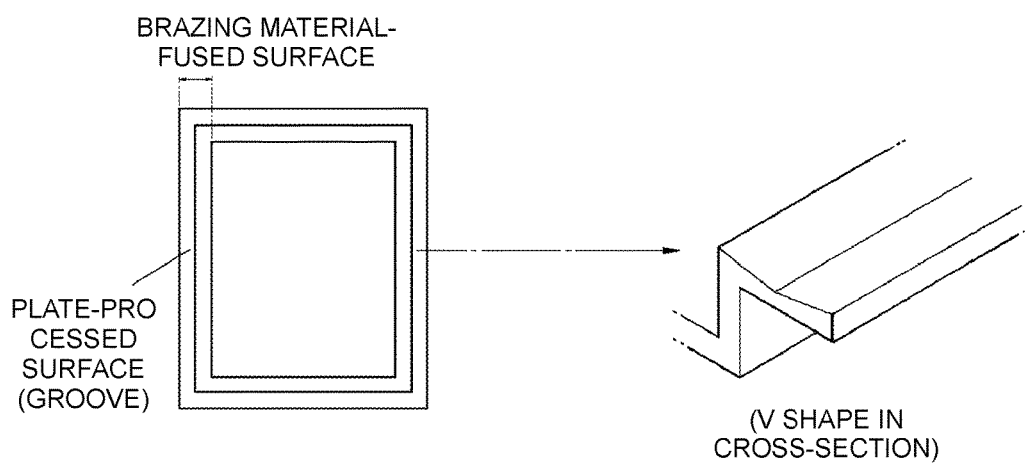
FIG. 4 is a view describing a specific shape (V shape in cross-section) of a brazing material-fused surface (work surface) in a sealing cap according to the present invention.

As a material of cap production, a hoop material made of kovar (dimension: 14 mm×1000 m, thickness of 40 mm) was prepared. This hoop material was subjected to drawing in a mold of forward feeding type to form a cavity, and then, made into individual pieces, thereby to produce a sealing cap. The drawing was performed by steps of supplying the hoop material into the mold, constraining the four sides thereof with a box-type jig, and pressing the center part with a processing jig. Through the above steps, a cap having a box-shaped cavity is produced. At this time, the site that is constrained by the constraining jig act as a flange. Here, a linear protrusion is formed on the surface of the constraining jig, and this linear protrusion forms a work surface having a groove on the flange surface (See FIG. 3).

The dimension of the cap after the molding may be, for example, such that the dimension of the cavity is 1.4 mm×1.0 mm with a depth of 0.2 mm, and the width of the flange surface is 0.1 mm. In the present embodiment, five kinds of caps with different widths or depths of the groove in the flange surface and a cap without having a groove were produced by changing the size of the linear protrusion in the constraining jig. For each of these kinds of caps and the cap without having a groove, 100 pieces of caps were produced.

After production of the cap, Ni plating and Au plating were performed on a surface including the flange surface and the sealing surface. The plating was performed by electrolytic barrel plating. The Ni plating was set to be 1 μm or more, and the Au plating was set to be 0.02 μm or less, in a thickness measurement at a flat part.

Subsequently, a brazing material was fused onto the flange surface that acts as the brazing material-fused surface of the cap. As the brazing material, a 80 wt % Au-20 wt % Sn brazing material having a frame shape (dimension: outer dimension of 1.6 mm×1.4 mm, inner dimension of 1.44 mm×1.24 mm, and a thickness of 13 μm) was fused. The fusion was performed with the brazing material positioned and mounted onto the cap, then the resultant was inserted into an electric furnace, and heated at 280° C. for 180 seconds to fuse the brazing material.

A sealing test was performed on the produced sealing cap (5 kinds×100 pieces), so as to confirm the wet-spreading property of the brazing material. The sealing test was performed with the produced cap bonded onto a base having a flat plate shape (dimension: 1.65 mm×1.25 mm, thickness of 0.15 mm, made of ceramics) (with a bonding temperature of 340° C.), so as to produce a simulative sealed package. Further, outer appearance observation was performed on the prepared package, so as to confirm the presence or absence of straying of the brazing material. Furthermore, a leakage test was performed. The leakage test was performed with the package applied to a helium leakage detector and the leakage of helium molecules was counted after the outside of the package was vacuumized, so that whether the air-tight sealing was good or poor should be determined. Thereafter, the cap was dismounted from the cap, so that the presence or absence of brazing material penetration onto the sealing surface was confirmed. These evaluations were performed on each of the 100 pieces of the caps.

TABLE 1

| | Cap brazing material-fused surface | | | | |
|---|---|---|---|---|---|
| | Groove | | Package evaluation | | |
| | dimension (width × depth) (μm) | Sc/Sf | Outer appearance | Leakage test | Brazing material penetration |
| Example 1 | 50 × 3 | 1.007 | Good | Good | 1/100 |
| Example 2 | 50 × 5 | 1.020 | Good | Good | 0/100 |
| Example 3 | 50 × 7 | 1.040 | Good | Good | 0/100 |
| Example 4 | 40 × 10 | 1.120 | Good | Good | 0/100 |
| Example 5 | 30 × 15 | 1.410 | Good | Good | 0/100 |
| Comparative Example 1 | Without groove (without processed surface) | 1.000 | Good | Good | 8/100 |

The brazing material penetration indicates the ratio of generation of packages in which spreading of the brazing material onto the sealing surface was present (population parameter=100)

From Table 1, it will be noted that, in the cap of the Comparative Example in which the brazing material-fused surface had not been processed, there was a trace of penetration of the wet-spread brazing material onto the sealing surface, though with a little probability (8%). There was little trace of penetration in each of the Examples. It seems that the processing of this time within a range of the Examples can suppress unfavorable wet-spreading of the brazing material. Here, with respect to the effect of airtight sealing, there were no problems in each of the Examples and the Comparative Example, and no leakage was seen.

Second Embodiment

Figure 6:
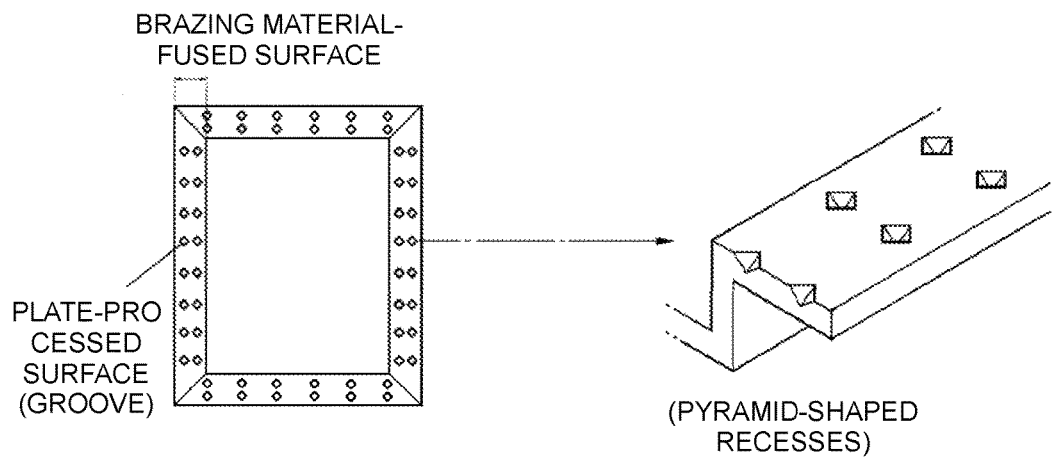
FIG. 6 is a view describing a specific shape (pyramid-shaped recesses) of a brazing material-fused surface (work surface) in a sealing cap according to the present invention.
Figure 7:
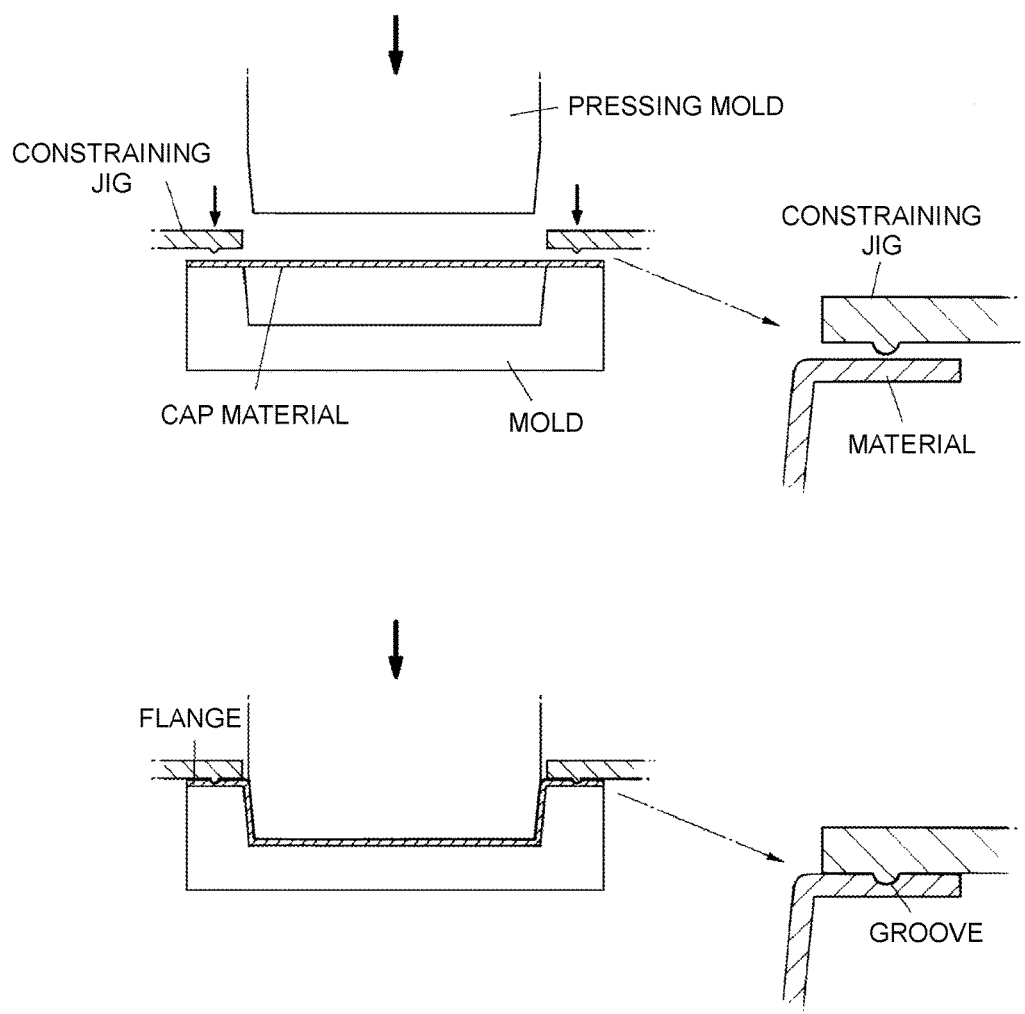
FIG. 7 is a view describing a step of molding a sealing cap evaluated in the first embodiment.

Here, a sealing cap was produced in which a plurality of pyramid-shaped recesses had been formed on the work surface that was to be imparted to the brazing material-fused surface of the cap (See FIG. 6). Though the basic production steps of the cap were the same as in the first embodiment, the cap was processed with use of a constraining jig having a surface mode in which a plurality of pyramid-shaped minute protrusions had been formed, in drawing. Regarding the cap produced in the present embodiment, the ratio (Sc/Sf) of a surface area (Sc) of the brazing material-fused surface per unit area to a surface area (Sf) of the sealing surface per unit area was about 1.4.

After production of the cap, Ni plating and Au plating were performed in the same manner as in the first embodiment, and then an Au—Sn brazing material was fused. However, in the present embodiment, two kinds of caps were prepared, that is, one in which Au plating had been formed to a thickness of 0.02 μm (same thickness as in the first embodiment) and one in which Au plating had been formed to a thickness of 0.01 μm which was smaller than that. Further, after fusion of the brazing material, a simulative package was prepared in the same manner as in the first embodiment and evaluated. The results are shown in Table 2.

TABLE 2

| | Cap brazing material-fused surface | | Package evaluation | | |
|---|---|---|---|---|---|
| | Au plating thickness (flat surface appearance measurement) | Sc/Sf | Outer appearance | Leakage test | Brazing material penetration |
| Example 6 | 0.02 μm | 1.400 | Good | Good | 0/100 |
| Comparative Example 1 | | 1.000 | Good | Good | 8/100 |
| Comparative Example 2 | 0.01 μm | | Good | Poorness present | 10/100 |

The brazing material penetration indicates the ratio of generation of packages in which spreading of the brazing material onto the sealing surface was present (population parameter=100)

It can be stated that processing the brazing material-fused surface is useful for stability in fusing the brazing material. In Comparative Example 2, a work surface was not formed on the brazing material-fused surface, and furthermore, the amount of Au plating was reduced. Leakage was seen in some of the caps of Comparative Example 2 when the package was fabricated. In a few of the caps in which the leakage occurred, the brazing material after fusion had a little distorted frame shape instead of a neat rectangular frame shape. It seems that the airtight sealing of the package was insufficient because a cap with a brazing material having such an indefinite shape was used. Further, in the cap having such a brazing material, the wet-spreading is not stable either, and also brazing material penetration onto the sealing surface is liable to occur.

Third Embodiment

Figure 5:
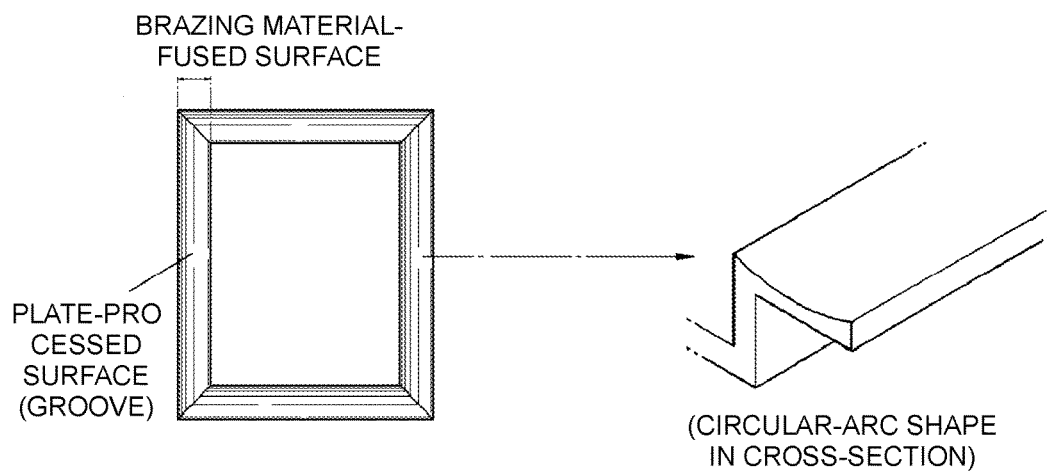
FIG. 5 is a view describing a specific shape (circular-arc-shaped cross-section) of a brazing material-fused surface (work surface) in a sealing cap according to the present invention.
Figure 8:
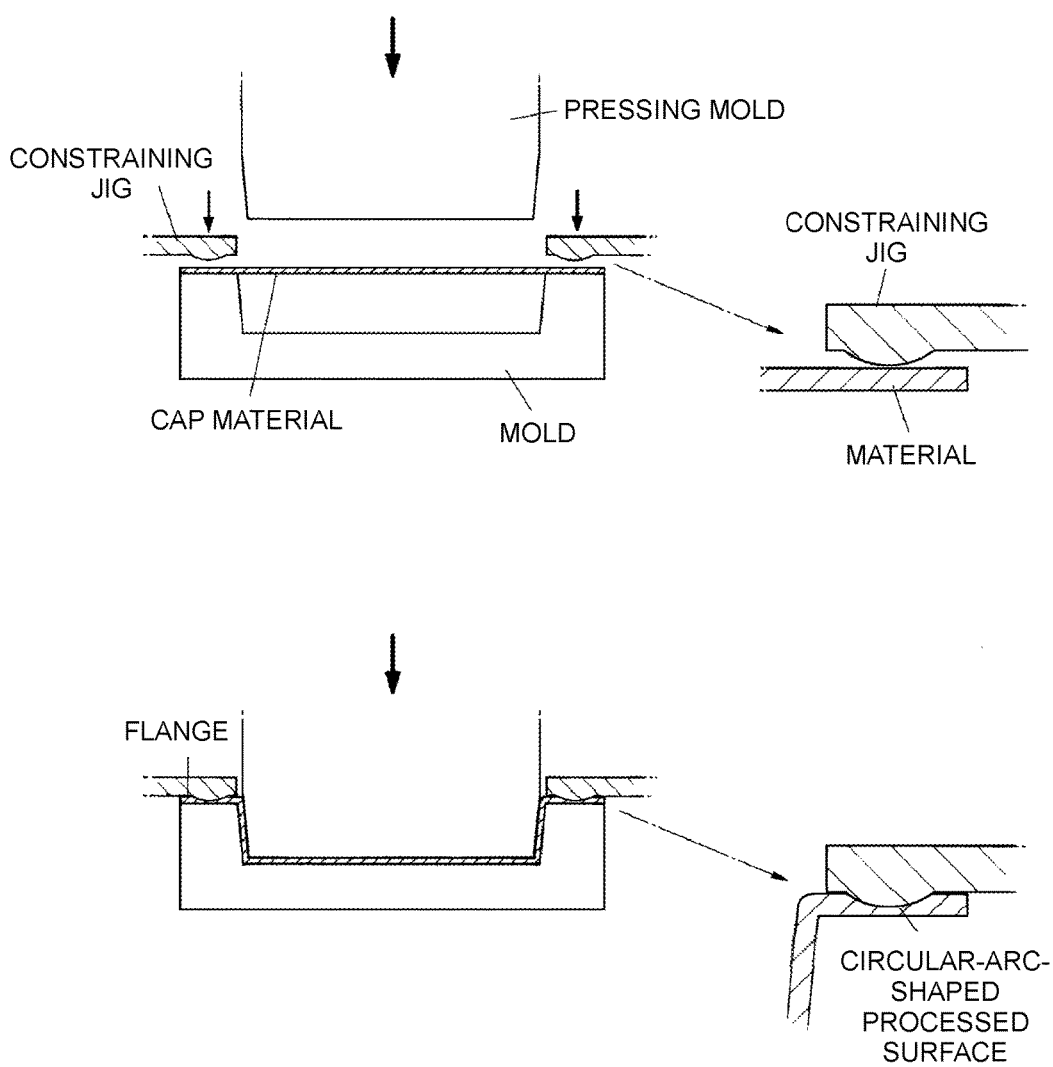
FIG. 8 is a view describing a step of molding a sealing cap evaluated in the third embodiment.

Here, a sealing cap was produced in which the work surface had a circular-arc-shaped cross-section (See FIG. 5). The basic production steps of the cap were the same as in the first embodiment, and the cap was processed with use of a constraining jig having a circular-arc shape in drawing, as shown in FIG. 8. In the cap produced in the present embodiment, the ratio (Sc/Sf) of a surface area (Sc) of the brazing material-fused surface per unit area to a surface area (Sf) of the sealing surface per unit area was about 1.01.

Figure 9:
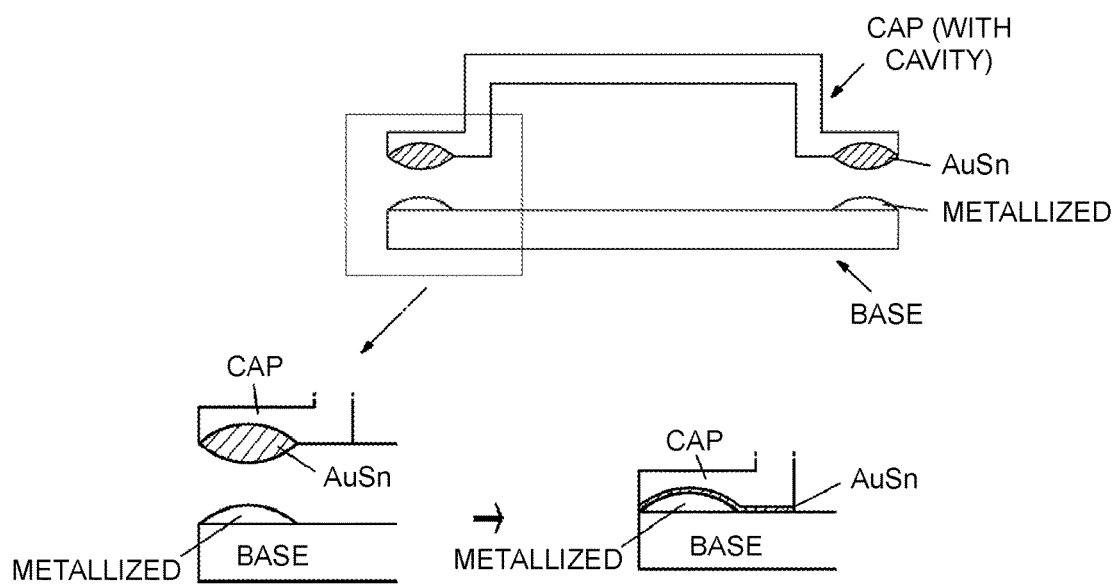
FIG. 9 is a view describing a sealing step when the cross-section is made to have a circular-arc shape.

After production of the cap, Ni plating and Au plating were performed, and thereafter an Au—Sn brazing material (0.01 μm) was fused. Then, a simulative package was fabricated, where the sealing work was performed after metallizing the base ends. FIG. 9 describes this sealing step. A suitable bonded state can be obtained in which the work surface of the cap after fusion of the brazing material fits to the shape of the metallization. In the present embodiment as well, 100 pieces of simulative packages were produced, where neither the leakage nor the brazing material penetration was seen at all even with a comparatively small brazing material thickness (0.01 μm).

From the first to third embodiments described above, it has been confirmed that a more stable package can be produced by performing a suitable processing on the brazing material-fused surface of the cap and fusing the brazing material thereto.

INDUSTRIAL APPLICABILITY

By the present invention, a sealed package that is more stable and has a higher quality than a conventional one can be produced. The present invention is useful for production of various kinds of semiconductor element devices such as SAW filters, FBAR filters, and quartz oscillators, and is also effective for reduction of the costs thereof.

The invention claimed is:

1. An electronic component cap for producing a package having a sealed region by being bonded to a base, wherein
the cap has a brazing material-fused surface to which a brazing material is fused and a sealing surface corresponding to the sealed region,
the brazing material-fused surface has a non-flat work surface formed by plastic working, and
a ratio (Sc/Sf) of a surface area (Sc) of the brazing material-fused surface per unit area to a surface area (Sf) of the sealing surface per unit area satisfies $1 < Sc/Sf \leq 1.6$.

2. The electronic component cap according to claim 1, wherein a cross-sectional shape of the work surface is a shape having a groove that protrudes from a flat surface.

3. The electronic component cap according to claim 1, wherein a cross-sectional shape of the work surface is an approximately V shape that descends downwards from both ends toward a center.

4. The electronic component cap according to claim 1, wherein a cross-sectional shape of the work surface is a circular-arc shape that extends downwards from both ends toward a center.

5. The electronic component cap according to claim 1, wherein at least one of a protrusion that protrudes upwards and a recess that protrudes downwards is formed as the work surface.

6. The electronic component cap according to claim 1, wherein an Au-based brazing material is fused to the brazing material-fused surface.

7. The electronic component cap according to claim 1, which has a flat plate shape, wherein the brazing material-fused surface having a frame shape is set along four sides of the flat plate shape.

8. The electronic component cap according to claim 1, wherein the cap has a box shape with a cavity formed, and the brazing material-fused surface having a frame shape is set along an end surface of the cap.

9. The electronic component cap according to claim 8, comprising a cap body that forms the cavity and a flange section formed at an end of the cap body, wherein the brazing material-fused surface having a frame shape is set along an end surface of the flange.

10. The electronic component cap according to claim 2, wherein an Au-based brazing material is fused to the brazing material-fused surface.

11. The electronic component cap according to claim 3, wherein an Au-based brazing material is fused to the brazing material-fused surface.

12. The electronic component cap according to claim 4, wherein an Au-based brazing material is fused to the brazing material-fused surface.

13. The electronic component cap according to claim 5, wherein an Au-based brazing material is fused to the brazing material-fused surface.

14. The electronic component cap according to claim 2, which has a flat plate shape, wherein the brazing material-fused surface having a frame shape is set along four sides of the flat plate shape.

15. The electronic component cap according to claim 3, which has a flat plate shape, wherein the brazing material-fused surface having a frame shape is set along four sides of the flat plate shape.

16. The electronic component cap according to claim 4, which has a flat plate shape, wherein the brazing material-fused surface having a frame shape is set along four sides of the flat plate shape.

17. The electronic component cap according to claim 5, which has a flat plate shape, wherein the brazing material-fused surface having a frame shape is set along four sides of the flat plate shape.

18. The electronic component cap according to claim 6, which has a flat plate shape, wherein the brazing material-fused surface having a frame shape is set along four sides of the flat plate shape.

19. The electronic component cap according to claim 2, wherein the cap has a box shape with a cavity formed, and the brazing material-fused surface having a frame shape is set along an end surface of the cap.

20. The electronic component cap according to claim 3, wherein the cap has a box shape with a cavity formed, and the brazing material-fused surface having a frame shape is set along an end surface of the cap.

* * * * *